United States Patent
Chen et al.

(10) Patent No.: US 10,201,086 B2
(45) Date of Patent: Feb. 5, 2019

(54) ELECTRONIC DEVICE

(71) Applicant: Siliconware Precision Industries Co., Ltd., Taichung (TW)

(72) Inventors: Lu-Yi Chen, Taichung (TW); Cheng-Hsiang Liu, Taichung (TW); Chang-Lun Lu, Taichung (TW); Jun-Cheng Liao, Taichung (TW); Cheng-Yi Chen, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/295,010

(22) Filed: Oct. 17, 2016

(65) Prior Publication Data

US 2018/0042112 A1 Feb. 8, 2018

(30) Foreign Application Priority Data

Aug. 2, 2016 (TW) .............................. 105124409 A

(51) Int. Cl.
*H05K 1/18* (2006.01)
*H05K 1/11* (2006.01)
*H05K 3/34* (2006.01)

(52) U.S. Cl.
CPC ............. *H05K 1/181* (2013.01); *H05K 1/111* (2013.01); *H05K 3/341* (2013.01); *H05K 3/3442* (2013.01); *H05K 2201/09663* (2013.01); *H05K 2201/10636* (2013.01)

(58) Field of Classification Search
USPC ......................................... 361/767, 752, 808
See application file for complete search history.

(56) References Cited

U.S. PATENT DOCUMENTS

| 2014/0333339 A1* | 11/2014 | Orr ...................... | G01R 31/002 |
| | | | 324/756.02 |
| 2016/0029491 A1* | 1/2016 | Tomohiro ............. | H01L 25/105 |
| | | | 361/767 |

* cited by examiner

*Primary Examiner* — Andargie M Aychillhum
(74) *Attorney, Agent, or Firm* — Mintz Levin Cohn Ferris Glovsky and Popeo, P.C.; Peter F. Corless; Steven M. Jensen

(57) ABSTRACT

An electronic device includes a circuit board having a plurality of conductive contacts, and an electronic component disposed on the circuit board and having a plurality of electrode terminals. The conductive contacts include a plurality of solder pads spaced apart from each other, and are coupled to the electrode terminals, respectively. The stress generated by any one of the electrode terminals is distributed to all of the solder pads so as to prevent the electronic component from being offset during an assembly process.

6 Claims, 3 Drawing Sheets

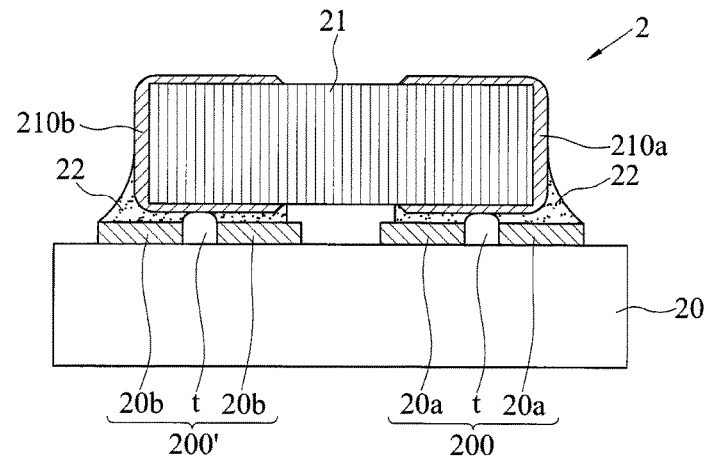
FIG.2
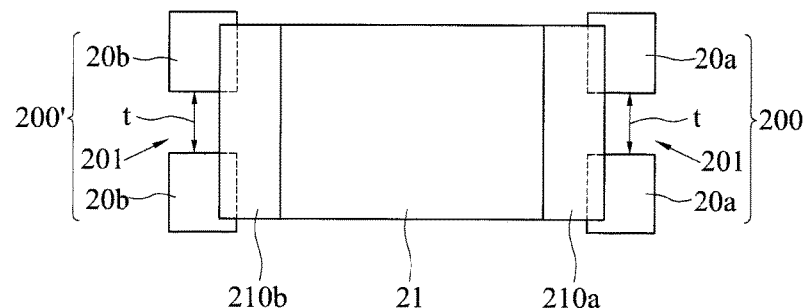
FIG.2'
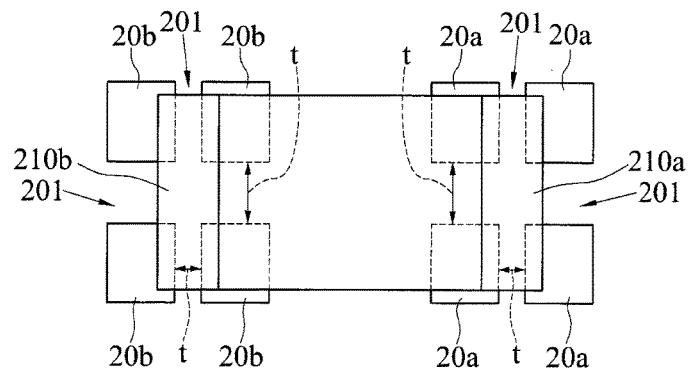
FIG.2"

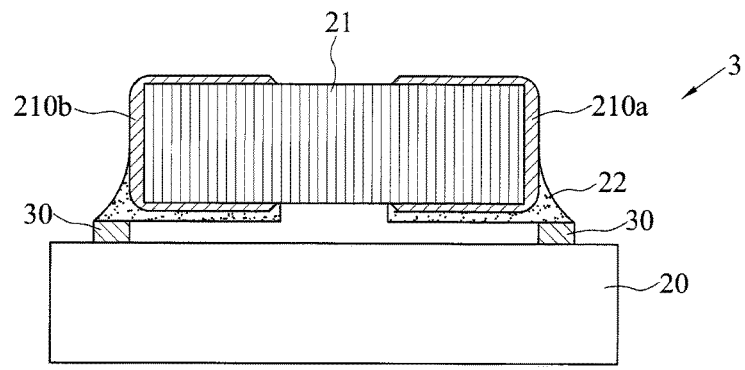
FIG.3
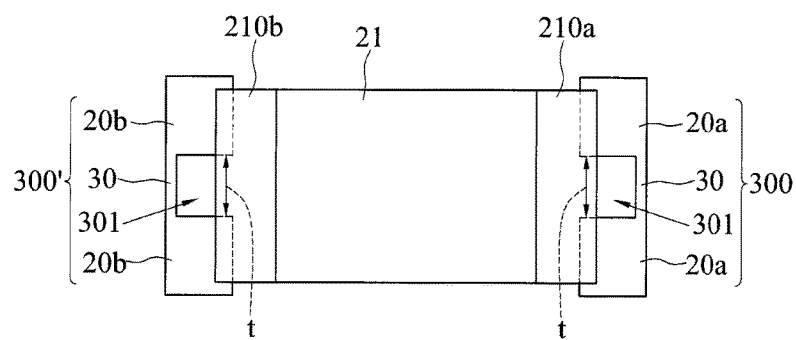
FIG.3'
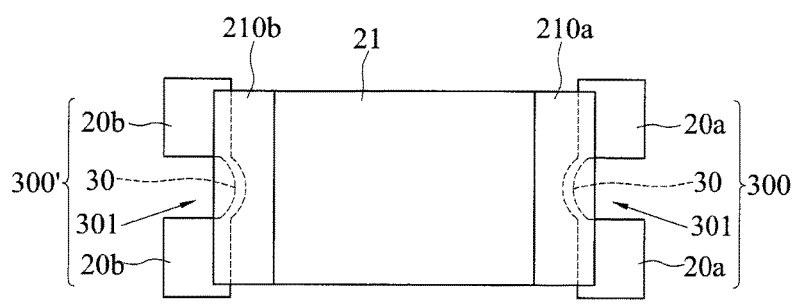
FIG.3"

ELECTRONIC DEVICE

CROSS-REFERENCE TO RELATED APPLICATION

This application claims under 35 U.S.C. § 119(a) the benefit of Taiwanese Patent Application No. 105124409 filed Aug. 2, 2016, the entire contents of which are incorporated herein by reference.

BACKGROUND

1. Technical Field

The present disclosure relates to electronic devices, and, more particularly, to an electronic device using surface mounted technology (SMT).

2. Description of Related Art

As the technology of fabricating integrated circuit advances, both the design and fabrication of electronic elements favors miniaturization with highly integrated and large scaled circuit, and, as such, a more complete functionality for its product is provided.

In such a scenario, the electronic element disposed on the circuit board using the traditional through hole technology (THT) still has the drawbacks that the electronic element has a size that cannot be further reduced and thereby occupies a large area of the circuit board, and the assembly requires drilling holes on the circuit board based on each of leads. These lead also occupy the area of the opposing sides of the circuit board. Further, the solder points whereby the electronic element is connected to the circuit board are also relatively large. Therefore, the modern assembly process employs SMT to assemble electronic devices onto a circuit board.

With the use of SMT, electrode terminals (or leads) are bonded on the same surface of the circuit board, and there is no need to drill holes on the circuit board. In other words, it is possible to assemble different electronic elements on the opposite sides of the circuit board using SMT, thereby greatly improving the space utilization ratio. In addition, since the SMT electronic element has smaller size than the traditional electronic element using THT, more electronic elements can be disposed on the circuit board, thereby meeting the requirement for compact, low profile, high functionality, high speed and high frequency. As a result, SMT assembly method has become more and more popular.

Referring to FIGS. 1 and 1', a cross-sectional view and top view of a conventional electronic device 1 using SMT are shown, respectively. Firstly, a circuit board 10 covered by a solder mask layer 101 is provided. The circuit board 10 has a plurality of solder pads 100 exposed from the solder mask layer 101. Then, a print screening technology is utilized to form a solder paste 12 on the solder pads 100 which are exposed from the solder mask layer 101. Subsequently, an electrode terminal 110 of an electronic element 11 such as a passive element is bonded onto the solder paste 12, and the solder paste 12 is then reflowed, such that the electrode terminal 110 of the electronic element 11 is electrically connected to the solder pads 100 of the circuit board 10.

However, during the reflow process, the electronic element 11 may suffer from a shift problem, or have one side tilted, causing a so-called Tombstoning problem, due to the unevenness of the solder paste 12 being applied on the left and right sides. Further, as the electronic products become more compact, the size for the solder pads 100 and the electronic element 11 must be miniaturized, and the precision requirement for placing the electronic element 11 is demanding, such that the amount of the solder paste 12 being applied must be precise. As a result, the problem of the electronic element 11 that is offset is getting worse.

Furthermore, if the electronic element 11 is packaged using Fan-Out Wafer Level Package (FOWLP), the overall thickness of the circuit structure is generally below 50 um, and there is no rigid circuit board provided as a supporting structure, such that the electrode terminal 110 may likely generate a stress due to its large area, causing delamination of the electronic element 11 during assembly.

The solder paste 12 which has a large size will melt again during the subsequent high temperature process, and a great amount of heat would be transferred to the electronic element 11 from the solder paste 12, thereby increasing the risk of deformation of the circuit layer of the electronic element 11.

Therefore, there is an urgent need for solving the foregoing problems.

SUMMARY

In light of the foregoing drawbacks, the present disclosure provides an electronic device, comprising: a circuit board having a plurality of conductive contacts, wherein each of the conductive contacts comprises a plurality of solder pads, and a gap exists between any two adjacent ones of the solder pads; and an electronic element disposed on the circuit board and having a plurality of electrode terminals, each of electrode terminals being coupled to each correspond one of the conductive contacts.

In an embodiment, the conductive contacts further comprise conductive wires connected with the solder pads. In another embodiment, the conductive wires are located within or outside of a projecting area of the electronic element from a top view.

In an embodiment, the electrode terminals are bonded to the conductive contacts via a solder material.

From the above, the electronic device according to the present disclosure provides the conductive contacts comprising a plurality of solder pads and a gap existing between any two adjacent ones of the solder pads. Therefore, the bonding area between the electrode terminals of the electronic element and the solder pads and the amount of the solder material are reduced. Also, the amount of the solder material is controllable. Comparing with the prior art, the electronic device of the present disclosure has similar amount of the solder material applied on the left and right sides, thereby preventing the electronic element from being offset or preventing the occurrence of the tombstoning problem. As such, even with the solder pads and the electronic element that are of extremely small sizes, the tombstoning problem can still be prevented from occurrence.

Furthermore, if the electronic element is fabricated via FOWLP technology, the stress generated by a single electrode terminal can be distributed to multiple solder pads. As such, in comparison with the prior art, the electronic element according to the present disclosure is less likely to experience delamination during assembly.

In addition, as the amount of the solder material is reduced, the heat transferred from the solder material to the electronic element can be reduced during the latter high temperature reflow process. Therefore, in comparison with the prior art, the electronic device of the present disclosure can greatly reduce the risk of deformation of the circuit layer.

BRIEF DESCRIPTION OF DRAWINGS

The present disclosure can be more fully understood by reading the following detailed description of the embodiments, with reference made to the accompanying drawings, wherein:

FIG. 1' is a simplified top view of a conventional electronic device;

FIG. 2 is a cross-sectional schematic view of an electronic device according to the present disclosure;

FIGS. 2' and 2" are simplified top views showing the electronic device of FIG. 2 in different embodiments;

FIG. 3 is a cross-sectional schematic view showing an electronic device in yet another embodiment according to the present disclosure; and FIGS. 3' and 3" are simplified top views showing the electronic device of FIG. 3 in different embodiments.

DETAILED DESCRIPTION OF PREFERRED EMBODIMENTS

Figure 1:
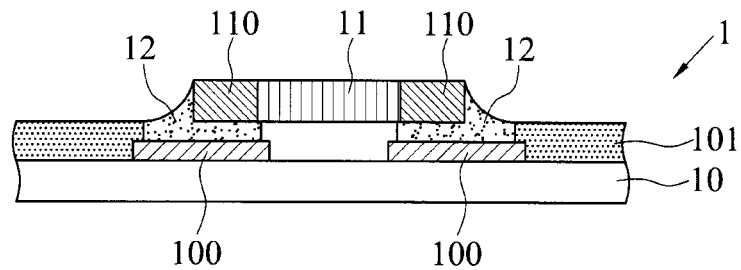
FIG. 1 is a cross-sectional schematic view of a conventional electronic device.
Figure 1:
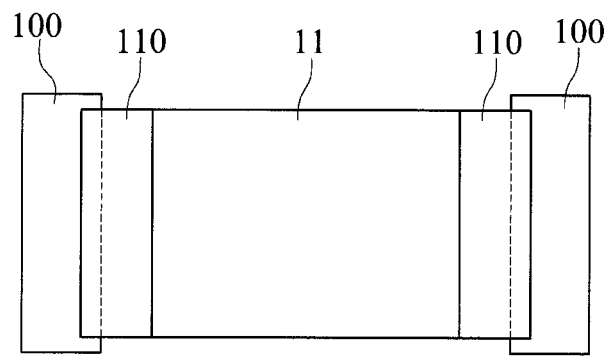

The present disclosure is described in the following with specific embodiments, so that one skilled in the pertinent art can easily understand other advantages and effects of the present disclosure from the disclosure of the present disclosure.

It should be noted that all the drawings are not intended to limit the present disclosure. Various modification and variations can be made without departing from the spirit of the present disclosure. Further, terms, such as "on", "first", "second" and "a", "an" and etc., are merely for illustrative purpose and should not be construed to limit the scope of the present disclosure.

FIG. 2 is a cross-sectional schematic view of an electronic device 2 according to the present disclosure. As shown in FIG. 2, the electronic device 2 comprises: a circuit board 20 having a plurality of solder pads (which are divided into a plurality of first solder pads 20a and a plurality of second solder pads 20b), and an electronic element 21 disposed on the circuit board 20.

The electronic element 21 has a first electrode terminal 210a and a second electrode terminal 210b, the single first electrode terminal 210a is bonded to a plurality of the first solder pads 20a, and the single second electrode terminal 210b is bonded to a plurality of the second solder pads 20b, as shown in FIGS. 2, 2' and 2".

In an embodiment, the electronic element 21 is an active element, a passive element or a combination thereof, wherein the active element can be, for example, a semiconductor chip, and the passive element can be, for example, a resistor, a capacitor or an inductor. As shown in FIG. 2, the electronic element 21 is emplified as a passive element.

The first electrode terminal 210a and the second electrode terminal 210b are bonded to the corresponding first solder pads 20a and the second solder pads 20b, respectively by a solder material 22. As such, during the assembly process, after the solder material 22 is reflowed, the electronic element 21 uses its first electrode terminal 210a and second electrode terminal 210b to be electrically connected to the corresponding first solder pads 20a and second solder pads 20b, respectively.

Also, as shown in FIGS. 2, 2' and 2", a plurality of first solder pads 20a can be regarded as a conductive contact 200, and a plurality of second solder pads 20b can be regarded as another conductive contact 200', such that the first electrode terminal 210a and the second electrode terminal 210b of the electronic element 21 are bonded to the corresponding single conductive contacts 200 and 200', respectively. The conductive contact 200 comprises a plurality of spaced apart first solder pads 20a, and the another conductive contact 200' comprises a plurality of spaced apart second solder pads 20b.

When the conductive contacts 200 and 200' are fabricated, least one groove 201 can be formed on a bond pads 100 of FIG. 1, such that the groove 201 penetrates a middle portion of the bond pad 100, as shown in FIGS. 2' and 2", to form a plurality of first solder pads 20a which are spaced apart from each other (or a plurality of spaced apart second solder pads 20b). In other words, there is a gap t existing between two adjacent ones of the first solder pads 20a (or a gap t exists between two adjacent ones of the second solder pads 20b).

In another embodiment, the first solder pads 20a (or the second solder pads 20b) can be also formed by, but not limited to, electroplating, depositing or spinning methods.

In another embodiment, as shown in the electronic device 3 of FIGS. 3 and 3', the first solder pads 20a (or the second solder pads 20b) are connected by at least one conductive wire 30, such that the first solder pads 20a and the conductive wire 30 serve as a conductive contact 300, to allow the single first electrode terminal 210a to be boned to the single conductive contact 300. Similarly, the second solder pads 20b and the conductive wire 30 serve as another conductive contact 300', to allow the single second electrode terminal 210b to be bonded to the conductive contact 300'. In an embodiment, when the conductive contact 300 is fabricated, at least one recessed portion 301 can be formed on the edge of the bond pad 100 of FIG. 1', so as to form a plurality of first solder pads 20a and a conductive wire 30 connecting the first solder pads 20a, as shown in FIG. 3'. There is a gap t existing between two adjacent ones of the first solder pads 20a. The conductive contact 300' can be fabricated in a similar fashion.

In an embodiment, the first solder pads 20a and the conductive wires 30 (or the second solder pads 20b and the conductive wire 30) can be also formed by, but not limited to, electroplating, depositing or spinning methods.

In an embodiment, the recessed portion 301 faces towards the middle portion of the electronic element 21 (or the circuit board 20), such that the conductive wire 30 is located in a region outside of the projecting area of the electronic element 21 perpendicular to the circuit board 20. In another embodiment, the conductive wire 30 can be located within the projecting area of the electronic element 21 perpendicular to the circuit board 20, as shown in FIG. 3". Alternatively, as shown in the conductive contact 300 of the embodiments shown in FIGS. 3' and 3", the recessed portion 301 and the conductive wire 30 are completely located within the projecting area of the electronic element 21 perpendicular to the circuit board 20 (not shown).

In an embodiment, the conductive wire 30 can be in a shape of a straight line (as shown in FIG. 3'), a curved line (as shown in FIG. 3"), or any other appropriate shapes.

As such, there are many embodiments of the conductive contacts according to the present disclosure, which will not illustrated here, as long as they meet the requirement of bonding a single electrode terminal to a plurality of solder pads.

In summary, in the electronic devices 2 and 3 according to the present disclosure the solder pads have their size reduced, such that the bonding area between the electrode terminal of the electronic element 21 and the conductive contacts 200, 200', 300, 300' is smaller than that of the solder pads in the prior art. When the first electrode terminal 210a and second electrode terminal 210b of the electronic element 21 according to the present disclosure are bonded to the first solder pads 20a and the second solder pads 20, respectively, the electrode terminal on a single side is supported by a plurality of smaller solder pads, such that the bonding area between the electrode terminal and the solder pads is reduced, and the amount of the solder material 22 used is in turn reduced, thereby making it easier to control the amount of the solder material.

As such, during the reflow process, it is easier to have the same amount of solder material on both the left and right side of the electronic element 21, thereby effectively preventing the electronic element 21 from being offset or tilted, and preventing tombstoning problem from occurrence. Even if the size of the first solder pads 20a, the second solder pads 20b and the electronic element 21 are extremely small, the present disclosure is still able to prevent tombstoning problem from occurrence.

In an embodiment, if the electronic element 21 is fabricated using FOWLP, the stress generated by the first electrode terminal 210a (or the second electrode terminal 210b) can be distributed to a plurality of first solder pads 20a (or a plurality of second solder pads 20b), thereby avoiding delamination of the electronic element 21 during assembly.

Since the amount of the solder material 22 can be reduced, during the reflow process where the solder material 22 is melted again in a high temperature process, the heat transferred from the solder material 22 to the electronic element 2 can be reduced, thereby significantly reducing the risk of deformation of the circuit layer of the electronic element 21.

The present disclosure has been described using exemplary preferred embodiments. However, it is to be understood that the scope of the present disclosure is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An electronic device, comprising:
    a circuit board having a plurality of conductive contacts, each of the conductive contacts comprising a plurality of solder pads with a gap existing between any two adjacent ones of the solder pads; and
    an electronic element disposed on the circuit board and having a plurality of electrode terminals, each of the electrode terminals being coupled to each corresponding one of the conductive contacts through the solder pads, and a single electrode terminal of the electrode terminals is coupled to the plurality of solder pads of a single conductive contact, wherein at least a portion of the single electrode terminal is located in a vertical projection area of the plurality of solder pads of the single conductive contact.

2. The electronic device of claim 1, further comprising a plurality of conductive wires electrically connecting to the solder pads of the single conductive contact.

3. The electronic device of claim 2, wherein the conductive wires are located in a region outside of a projecting area of the electronic element from a top view.

4. The electronic device of claim 2, wherein the conductive wires are located within a projecting area of the electronic element from a top view.

5. The electronic device of claim 2, wherein each of the conductive wires is in a shape of a straight line or a curved line.

6. The electronic device of claim 1, further comprising a solder material coupling the single electrode terminal to the single conductive contact.

* * * * *